May 6, 1969 J. O. BOWERS, JR 3,443,122

GATING CIRCUIT UTILIZING JUNCTION TYPE FIELD EFFECT TRANSISTOR AS INPUT DRIVER TO GATE DRIVER

Filed Nov. 3, 1965 Sheet 1 of 2

INVENTOR.
John O. Bowers, Jr.

BY B. B. Olive
ATTORNEY

INVENTOR.
John O. Bowers, Jr.
BY
B. B. Olive
ATTORNEY

United States Patent Office 3,443,122
Patented May 6, 1969

3,443,122
GATING CIRCUIT UTILIZING JUNCTION TYPE FIELD EFFECT TRANSISTOR AS INPUT DRIVER TO GATE DRIVER

John O. Bowers, Jr., Maitland, Fla., assignor, by mesne assignments, to General Dynamics Corporation, a corporation of Delaware Filed Nov. 3, 1965, Ser. No. 506,238
Int. Cl. H03k 19/08
U.S. Cl. 307—205 5 Claims

ABSTRACT OF THE DISCLOSURE

A two stage inverting gate driver circuit is described. The circuit is adapted to be embodied in an integrated circuit in a common substrate. A field effect transistor is directly coupled to a conventional transistor in a manner such that the field effect transistor is normally inhibited and the conventional transistor is normally cut off. When a command level is applied to the field effect transistor, source-drain current flows to the base of the conventional transistor rendering it fully conductive. The voltage level produced at the output of the conventional transistor is dependent exclusively upon its operating power supply voltage and is independent of the command input to the field effect transistor.

This invention is generally concerned with gating circuits such as those employed in analog switching networks. More specifically the invention is concerned with a gating circuit having a gate driver and an input driver to the gate driver which input driver employs a junction type field effect transistor productive of leveling and other effects.

The advent of microelectronics and integrated circuits has developed special needs for gating circuitry. In analog data circuits it is frequently desirable to have a gate driver adapted to operate within a relatively limited range of command input voltage levels but with relatively wide latitude in the output levels produced by the driver to drive the gate. That is, it is desirable to be able to vary the gate driver output levels over a wide range of value and polarity without having to change the command input level. The operation of a field effect junction transistor as an analog gate where the analog input data level goes below zero requires the gate driver to have, in its output levels, such a range of operation. The very nature of integrated circuits and substrate fabrication introduces special considerations. For example, a PNP transistor may be arranged to receive command input signals at some fixed level and the collector of the PNP transistor may be connected to the base of a following NPN transistor serving as an inverter driver. Such an inverter driver can operate over a wide range of output levels without any requirement of having to change the command signal output level. However, the NPN–PNP transistor combination is difficult to reduce to substrate fabrication and integrated circuit form and would therefore fail to meet the objectives of the present invention.

The invention recognizes both the unique problems presented by integrated gating circuits and the unique characteristics of a field effect junction transistor to solve such problems. The circuits provided by the invention lend themselves particularly to analog data gating circuits employing field effect junction transistors and MOS type field effect transistors. Various leveling and logic functions are achieved in a manner heretofore unknown in the art.

An object of the invention is to provide an input driver to a gate driver which gives the gate driver, when on, the capacity to operate at various output levels.

Another object is to provide a gate driver wherein the command signal input level to the gate driver is not required to follow the B minus output level of the gate driver.

Another object is to provide a gate driver which allows selection of the B plus and B minus output levels without any requirement for changing command signal input level to the driver and which driver lends itself to substrate fabrication and integrated form.

A more specific object is to utilize a field effect junction type transistor as an input driver to a following inverter driver and wherein such transistor performs a level shifting function.

Another object is to utilize a field effect junction transistor as an input driver to a following inverter driver and wherein such transistor may have command input drive signals introduced at its gate or source or at both gate and source to effect leveling and/or logic functions.

Another general object is to provide an improved driver for an analog gating device which lends itself to fabrication in both discrete and integrated circuit form.

The foregoing and other objects will appear from the description to follow and in the drawings, in which.

Figures 1, 2:
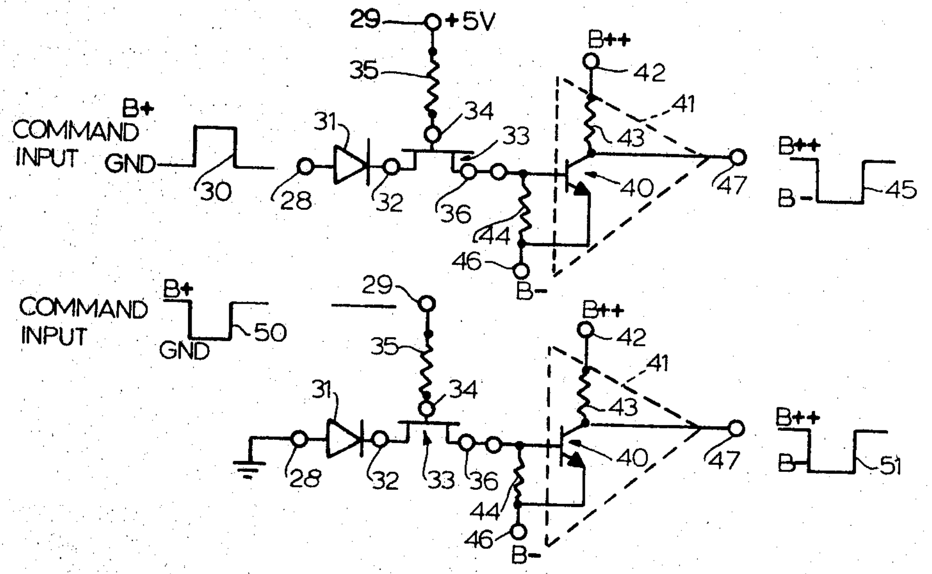
FIGURE 1 is a first embodiment wherein a P channel junction field effect (FET) transistor is used as an input driver for a following inverter driver and the command signals are fed to the source terminal.
FIGURE 2 is a second embodiment wherein the command signals are fed to the gate terminal of the FET transistor.
Figure 3:
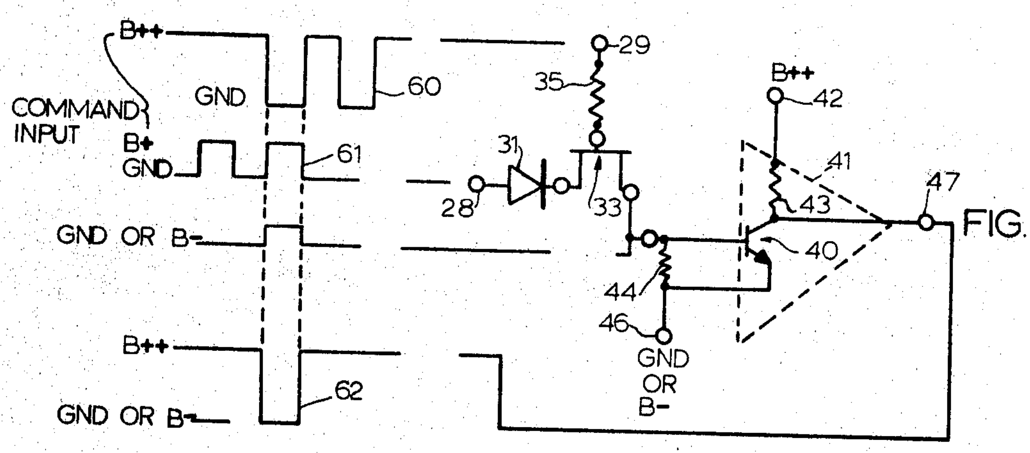
FIGURE 3 is a third embodiment wherein the command signals are used in the manner of logic and are fed to both source and gate terminals of the FET transistor.
Figure 4:
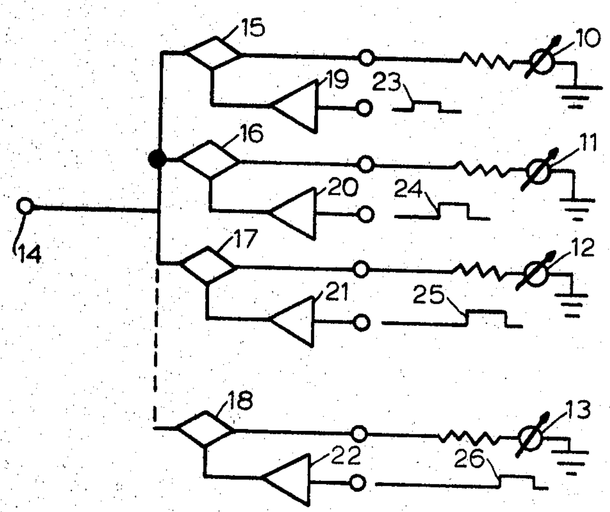
FIGURE 4 is a schematic illustration of an analog data sampling network employing circuits following the invention.

Prior to proceeding to a detailed description of FIGURE 1, reference is made to FIGURE 4 which schematically illustrates an analog data sampling network of a kind which may usefully employ the invention. In FIGURE 4, a number of analog data sources 10, 11, 12 and 13 for example and which may illustrate suitable transducers are multiplexed on a common output line 14 by sequential operation of a plural group of parallel switches, schematically illustrated at 15, 16, 17 and 18, which parallel switches are series connected on one side to the respective analog data sources 10, 11, 12 and 13 and on the other side to the common output line 14. These parallel switches are in turn gated by corresponding gate driver circuits 19, 20, 21 and 22 which respond to appropriate command signals generally indicated at 23, 24, 25 and 26. In applying the invention illustrated by FIGURES 1, 2 and 3 to the FIGURE 4 circuit, the analog switching function of each of the mentioned parallel switches 15, 16, 17 and 18 may, for example, be performed by an FET transistor and the mentioned gate driver circuits 19, 20, 21 and 22 may each include an FET input driver and inverter driver circuit of the type illustrated by FIGURES 1, 2, and 3. With such an arrangement and as later explained in more detail, the output levels of the gate driver circuits 19, 20, 21 and 22 may operate over a relatively wide range of levels while the command signals 23, 24, 25 and 26 remain at a relatively fixed level. It is to be understood of course that FIGURE 4 represents merely one mode of operation of the invention and that the circuits of FIGURES 1, 2 and 3 are generally applicable as gate driver circuits where the device to be switched partakes of the character of a field effect transistor.

In FIGURE 1 which represents a first embodiment, the command input signal 30 is generally represented as operating between ground and a B plus level. Signal 30 is fed through terminal 28, through a noise limiting diode 31 to the source terminal 32 of a P channel junction field effect transistor 33. The gate terminal 34 is biased through a resistor 35 by a positive 5 volt potential applied at terminal 29. The drain terminal 36 is connected to the base of a NPN transistor 40 forming an inverter driver circuit indicated by the dashed line box 41. A suitable voltage B plus plus is applied to terminal 42 and through current limiting resistor 43 to the collector of transistor 40. A resistor 44 is connected between the base and the emitter of transistor 40 and a B minus supply is connected at terminal 46 to the emitter of transistor 40. The driver output signal or level is indicated at 45 as being between the B minus level of terminal 46 and the B plus plus level of terminal 42. While the associated gate device is not shown it should be understood that it is this driver output signal 45 on terminal 47 which controls the gating device being employed in association with the circuitry of FIGURE 1. For example assuming the command signal 30 in FIGURE 1 is the command signal 23 in FIGURE 4 and gate 15 in FIGURE 4 is an FET type gate then the driver output signal 45 of FIGURE 1 would control the on-off condition of this gate.

In explaining the operation of FIGURE 1, the characteristic of a P channel junction FET transistor, such as transistor 33, requires that the gate terminal 34 must remain more positive than whichever of source and drain terminals 32, 36 is at the higher positive value. Thus, when the command signal 30 is at the ground level, transistor 33 is off and does not conduct. This action also keeps transistor 40 off. However, when the command signal 30 goes to the B plus level indicated, transistor 33 conducts which supplies base current to transistor 40 causing it to turn on. It is to be noted that this relationship is independent of the voltage existing on drain terminal 36 of transistor 33 and is therefore also independent of the B minus voltage applied at terminal 46 of the inverter driver circuit 41.

When transistor 40 is saturated the voltage level at the inverter driver output terminal 47 is thus controlled solely by the B minus level applied at terminal 46. When transistor 40 is off, the level at terminal 47 is controlled solely by the B plus plus level applied at terminal 42. As will be seen from later description in reference to FIGURES 2 and 3, this use of the FET type transistor as an input driver to a following inverter driver for a gate device permits the level at terminal 46 to be varied over a relatively wide range to achieve any desired output level at terminal 47 and without having to make any change in the level of the command signal 30. Assuming that the gate is an analog data gate and the gate itself comprises an FET transistor and that the circuit is an integrated circuit, those familiar with the art will readily appreciate the significance of the invention to achieving the desired leveling function in a substrate fabrication.

In FIGURE 2, the same basic arrangement as in FIGURE 1 is repeated and the same numerals are applied where applicable. Terminals 42 and 46 may receive the same applied voltage levels as in FIGURE 1. It will be noted however that in FIGURE 2 the command signal represented at 50 moves between ground and B plus levels and is fed to the previously referred to terminal 29 which connects to the gate terminal 34 of transistor 33. Terminal 28 in FIGURE 2 is connected to ground and an inverter driver output level indicated at 51 is obtained and fluctuates between the same levels as level 45 in FIGURE 1. In the case of FIGURE 2 it can be seen that the same leveling function is achieved and the same basic mode of operation except that in FIGURE 2, unlike FIGURE 1, the gate of transistor 33 receives the command signal and controls the on-off condition. The circuitry of FIGURE 2, of course, offers the same versatility, namely, that it lends itself particularly to integrated circuit form but equally as well to discrete circuit form.

In FIGURE 3, the basic circuitry remains the same. Either ground or B minus potential is maintained at terminal 46. As compared to FIGURES 1 and 2 it will be noted that a command input signal 60 operating between ground and B plus plus is introduced at terminal 29 for application through resistor 35 to gate terminal 34 of transistor 33. A separate command signal 61 operating between B plus and ground level and in an opposite polarity direction to signal 60 is applied at terminal 28 for application through diode 31 to source terminal 32 of transistor 33. Assuming signals 60, 61 are applied at the times indicated, that is such that they coincide as indicated, an inverter driver output signal 62, operating between B plus plus and ground or B minus, is achieved on terminal 47 and which coincides with signals 60 and 61. FIGURE 3 thus indicates an additional possible function of transistor 33 in addition to its leveling function, namely, that of providing a source of logic. For example, FIGURE 3 may be looked upon as an enabling or AND circuit in that signal 62 may be employed to open a succeeding gate dependent on signal 60 coinciding with signal 61 as shown.

Figure 5:
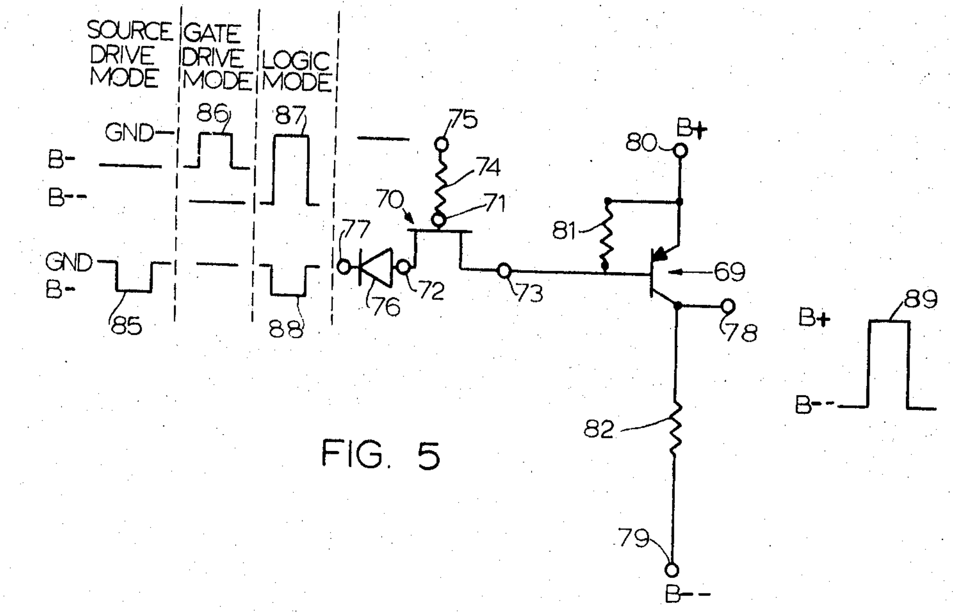
FIGURE 5 is a composite mode diagram of N channel FET and PNP driver.
Figure 6:
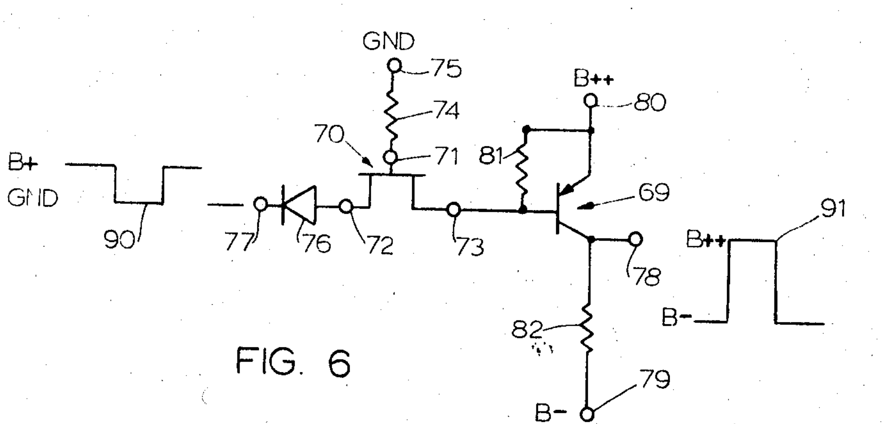
FIGURE 6 is like FIGURE 5 but for a particular source drive mode and level shifting operation.

Using FIGURES 1, 2 and 3 as a reference, FIGURE 5 depicts in a composite diagram the complementary operation of a P channel FET transistor input driver and an PNP inverter driver. The separate functions or modes illustrated by FIGURES 1, 2 and 3 namely source drive, gate driver and logic mode, respectively, are grouped in FIGURE 5. For example for the source drive mode in FIGURE 5, with terminal 75 at ground or B minus, with the command input signal 85 fluctuating between ground and B minus at terminal 77, with B plus on terminal 80, B minus minus on terminal 79, the output level on terminal 78 would appear as signal 89 fluctuating between B plus and B minus minus levels. For the gate drive mode, signal 86 moving between ground and B minus will with terminal 77 held at ground produce the same output level shift on terminal 78. The logic mode is explained with reference to command signals 87 and 88. In FIGURES 5 and 6, the invention is shown with reference to a P channel FET transistor 70 employed as the input driver and having source 72, gate 71 and drain 73 terminals. The inverter driver in the case of FIGURES 5 and 6 comprises a PNP transistor 69. A noise limiting diode 76 is connected between terminal 77 and source terminal 72 and a biasing resistor 74 between terminal 75 and gate terminal 71 of FET transistor 70. In the inverter driver comprising transistor 69, resistor 81 is connected between the base of transistor 69 and terminal 80 and resistor 82 is connected between the collector of transistor 69 and terminal 79. The output of the inverter driver is obtained on terminal 78.

In FIGURE 6, the operation is explained with reference to the command signal 90 at terminal 77 operating between ground and B plus. Such operation with terminal 80 held at B plus plus and terminal 79 held at B minus produces the output signal 91 fluctuating between B plus plus and B minus levels.

With reference to FIGURES 5 and 6 it will be noted that all of the level shifting advantages of the invention are preserved in the N channel FET-PNP driver arrangement. It is also noted that these elements enjoy the same compatibility for integrated circuit use and preserve the capacity of the invention to be applied in discrete circuit form as well.

Having described the invention, what I claim is:

1. In a gate driver circuit of the type which includes:

(a) a first transistor having base, collector and emitter terminals;

(b) a B voltage source of predetermined voltage level including a current limiting resistor connected to said collector terminal;

(c) a gate driving output terminal connected to said collector terminal and exhibiting the level of said B voltage source when said transistor is off;

(d) a grounding terminal connected to said emitter terminal including means to hold said grounding terminal at some predetermined grounding voltage level;

(e) a resistor connected between said emitter and base terminals;

(f) an input terminal connected to said base terminal, the level of said output terminal being brought to the level of said grounding terminal when said transistor is turned on by the availability of current at said input terminal;

the improvement including in combination therewith:

(g) a field effect transistor switching element having gate, source and drain terminals, said drain terminal being connected to said input terminal;

(h) a command input signal source moving between two predetermined levels;

(i) means connecting said command signal source to at lease one of said switching element terminals while holding any switching element terminal not so connected at some predetermined level such that when said command signal source reaches some predetermined level said switching element is turned on and said drain terminal furnishes current to said base terminal to turn said first transistor on to bring said gate driving output terminal to the level of said grounding terminal, said field effect transistor thereby serving as an input driver to said first transistor gate driver whereby the level obtained at said gate driving output terminal may be varied over a substantially wide range of values while maintaining said command input signal source within a narrow range of values.

2. In a gate driver circuit as claimed in claim 1 wherein said command input signal source is connected to said source terminal only.

3. In a gate driver circuit as claimed in claim 1 wherein said command input signal source is connected to said gate terminal only.

4. In a gate driver circuit as claimed in claim 1 including a second command signal source connected to said gate terminal with said first command signal source being connected to said source terminal thereby enabling said gate driver circuit to be controlled in the manner of logic.

5. A circuit for generating an output voltage level in response to a command level comprising, (a) a field effect transistor having gate, source and drain electrodes, (b) a transistor having base, collector, and emitter electrodes for providing said output level at one of said emitter and collector electrodes, (c) one of said drain and source electrodes being connected to said base, (d) said emitter being conductively connected to said one of said drain and source electrodes, (e) means for applying operating voltages to said emitter and collector to normally bias said transistor to its off state, (f) means utilizing said transistor biasing voltages for biasing said field effect transistor to its off state in the absence of said command level, and (g) means for applying said command level between at least two electrodes of said field effect transistor.

References Cited

UNITED STATES PATENTS 3,327,133 6/1967 Sickles ------------- 307—251

OTHER REFERENCES

Gosling, Field Effect Transistor Applications, April 1965, English edition 1964, pp. 33, 34, 63 to 65, TK7872–T73G67.

ARTHUR GAUSS, *Primary Examiner.*

DONALD D. FORRER, *Assistant Examiner.*

U.S. Cl. X.R.

307—214, 243, 251, 270, 279; 330—35